(12) United States Patent
Enomoto et al.

(10) Patent No.: US 9,202,732 B2
(45) Date of Patent: Dec. 1, 2015

(54) APPARATUS AND METHOD FOR DETECTING SUBSTRATES

(75) Inventors: Masayuki Enomoto, Kobe (JP); Masao Takatori, Kobe (JP); Yohichi Nakamura, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 237 days.

(21) Appl. No.: 13/121,498

(22) PCT Filed: Sep. 29, 2009

(86) PCT No.: PCT/JP2009/066938
§ 371 (c)(1),
(2), (4) Date: Mar. 29, 2011

(87) PCT Pub. No.: WO2010/038735
PCT Pub. Date: Apr. 8, 2010

(65) Prior Publication Data
US 2011/0205354 A1    Aug. 25, 2011

(30) Foreign Application Priority Data
Oct. 1, 2008   (JP) .................. 2008-256268

(51) Int. Cl.
*H01L 21/67* (2006.01)
(52) U.S. Cl.
CPC ....... *H01L 21/67265* (2013.01); *Y10S 414/138* (2013.01)
(58) Field of Classification Search
CPC ................. H04N 2201/0408; H04N 1/00249; H04N 1/00267; H04N 5/253; H04N 1/193; H01L 21/67265; H01L 21/681; G05B 19/4015; Y10S 414/138; G06T 2207/30148; G06T 2215/12; G06T 2219/2004
See application file for complete search history.

(56) References Cited

U.S. PATENT DOCUMENTS

| 4,691,999 | A | * | 9/1987 | Wheeler .................. 359/859 |
| 5,225,691 | A | * | 7/1993 | Powers et al. .......... 250/559.4 |
| 5,540,098 | A | * | 7/1996 | Ohsawa ..................... 73/629 |
| 6,097,492 | A | * | 8/2000 | Kondo et al. ............ 356/614 |

(Continued)

FOREIGN PATENT DOCUMENTS

| JP | 60157230 | A | * | 8/1985 | |
| JP | 63131533 | A | * | 6/1988 | ............ H01L 21/68 |

(Continued)

OTHER PUBLICATIONS

Abstract of (JP 63131533 A) in English.*

(Continued)

*Primary Examiner* — Behrooz Senfi
*Assistant Examiner* — Mohammed Jebari
(74) *Attorney, Agent, or Firm* — Oliff PLC

(57) ABSTRACT

The substrate detection apparatus includes: a collimating reflector located on one side of substrates; an illumination unit configured to radiate light in a planar state toward the collimating reflector such that edge portions of the substrates are located in an optical path of the light; an image acquiring unit configured to acquire a passing light image including the edge portions formed on the collimating reflector with the light radiated in the planar state from the illumination unit; and an image processing unit configured to process the passing light image obtained by the image acquiring unit, thereby detecting the conditions of the substrates.

14 Claims, 6 Drawing Sheets

(56) References Cited

U.S. PATENT DOCUMENTS

| | | | |
|---|---|---|---|
| 6,144,926 A * | 11/2000 | Ishizawa et al. | 702/94 |
| 6,147,356 A * | 11/2000 | Hahn et al. | 250/559.29 |
| 2001/0043850 A1* | 11/2001 | Schlehahn et al. | 414/416.01 |
| 2003/0119214 A1* | 6/2003 | Kitazawa et al. | 438/5 |
| 2004/0207836 A1* | 10/2004 | Chhibber et al. | 356/237.4 |
| 2004/0249507 A1* | 12/2004 | Yoshida et al. | 700/245 |
| 2005/0242305 A1* | 11/2005 | Oka | 250/559.29 |
| 2008/0211991 A1 | 9/2008 | Wood | |
| 2011/0058167 A1* | 3/2011 | Knox et al. | 356/338 |

FOREIGN PATENT DOCUMENTS

| | | | |
|---|---|---|---|
| JP | 03239344 A * | 10/1991 | H01L 21/68 |
| JP | A-09-283603 | 10/1997 | |
| JP | A-2001-093964 | 4/2001 | |
| JP | A-2003-017548 | 1/2003 | |
| JP | A-2005-005347 | 1/2005 | |
| JP | A-2005-520350 | 7/2005 | |

OTHER PUBLICATIONS

International Search Report issued in Application No. PCT/JP2009/066938; Dated Nov. 2, 2009.

Oct. 19, 2012 Extended European Search Report issued in Application No. 09817767.8.

International Preliminary Report on Patentability issued in Application No. PCT/JP2009/066938; Dated May 10, 2011.

* cited by examiner

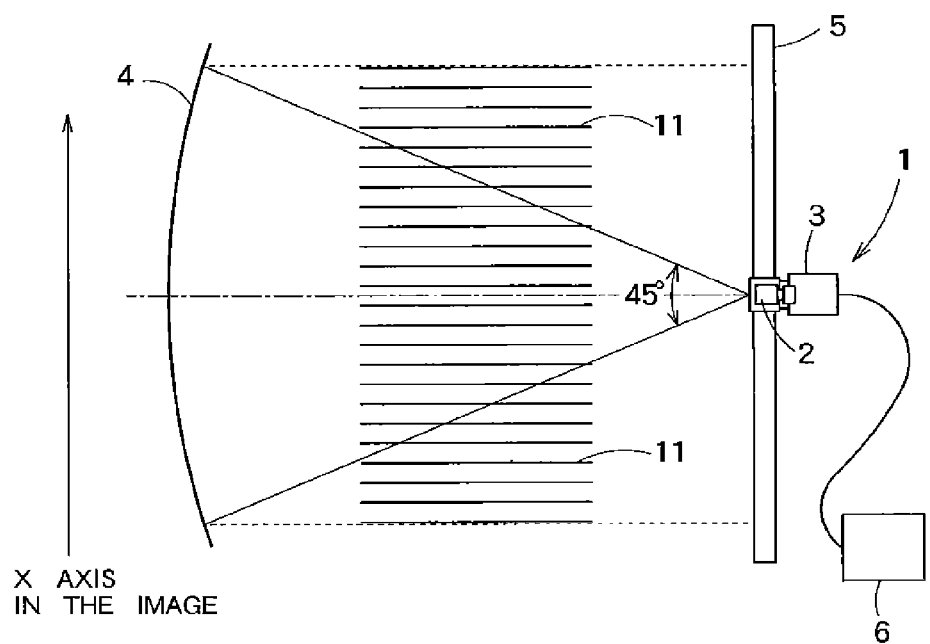
X AXIS IN THE IMAGE
F I G. 1A
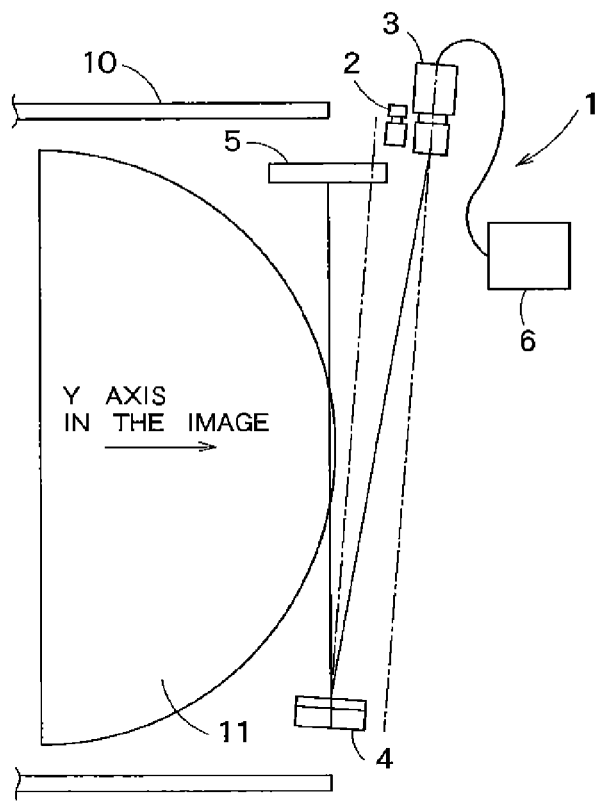
Y AXIS IN THE IMAGE
F I G. 1B

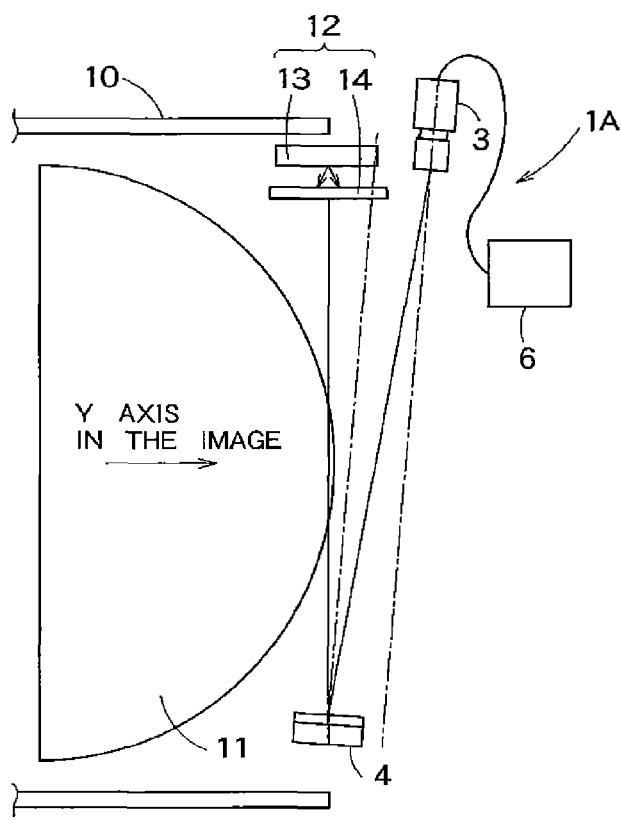
F I G. 3
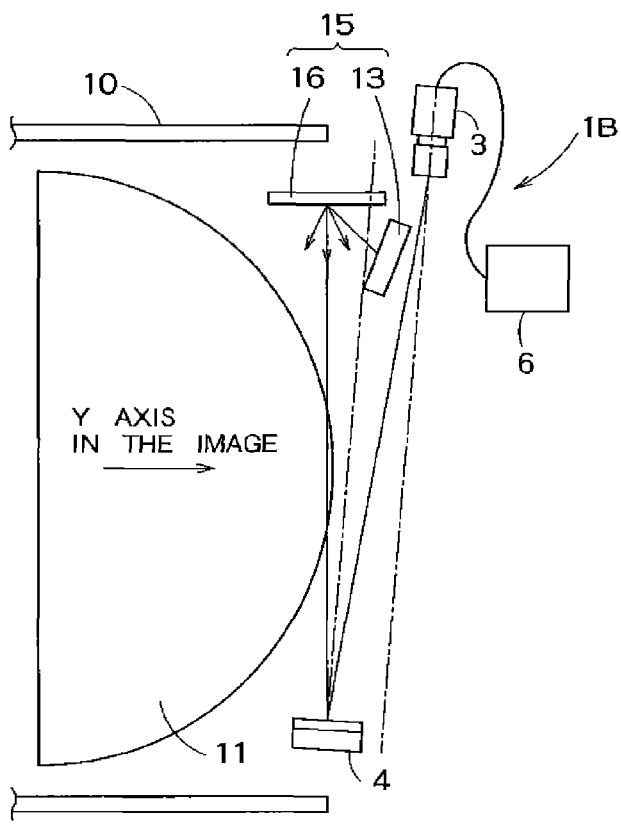
F I G. 4

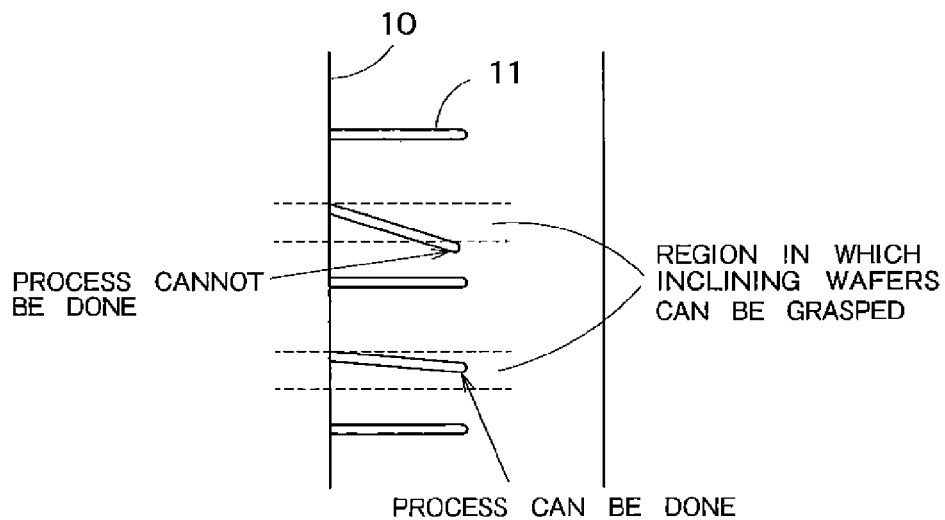
F I G. 7
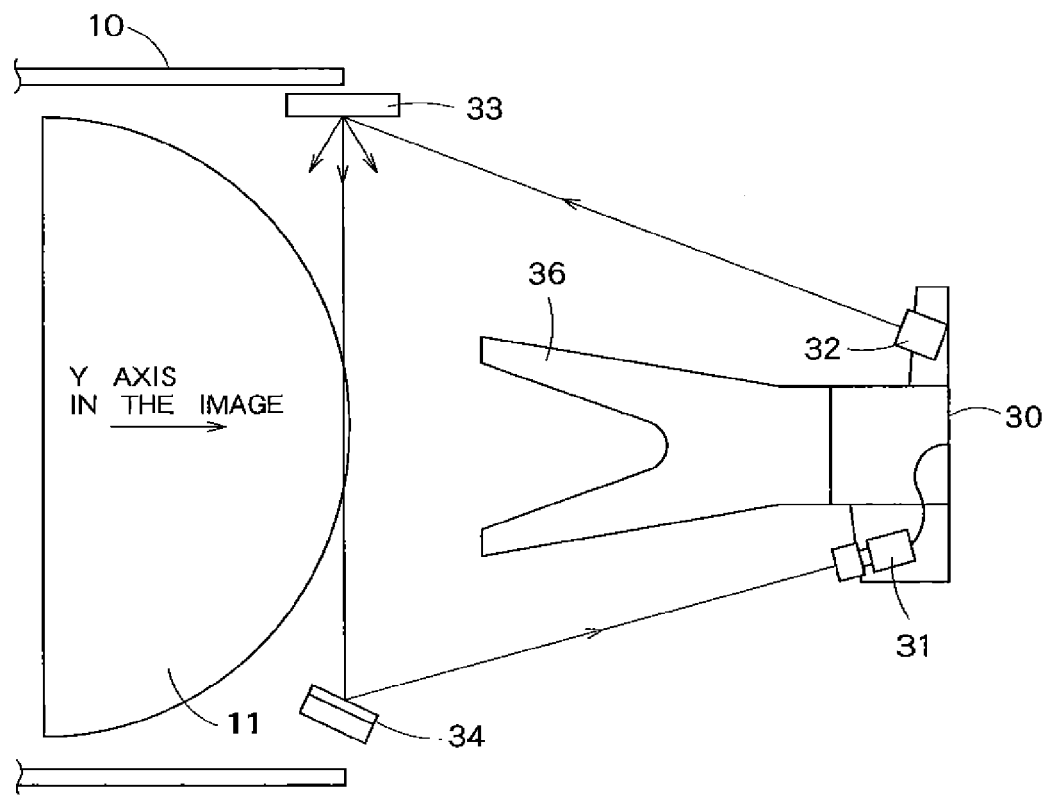
F I G. 8

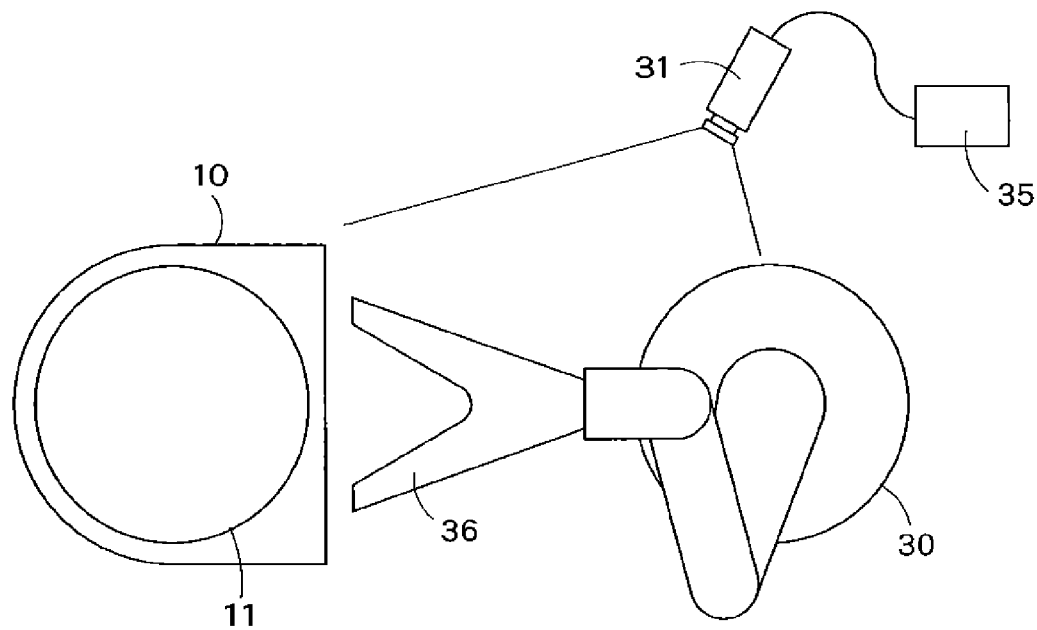
F I G. 9
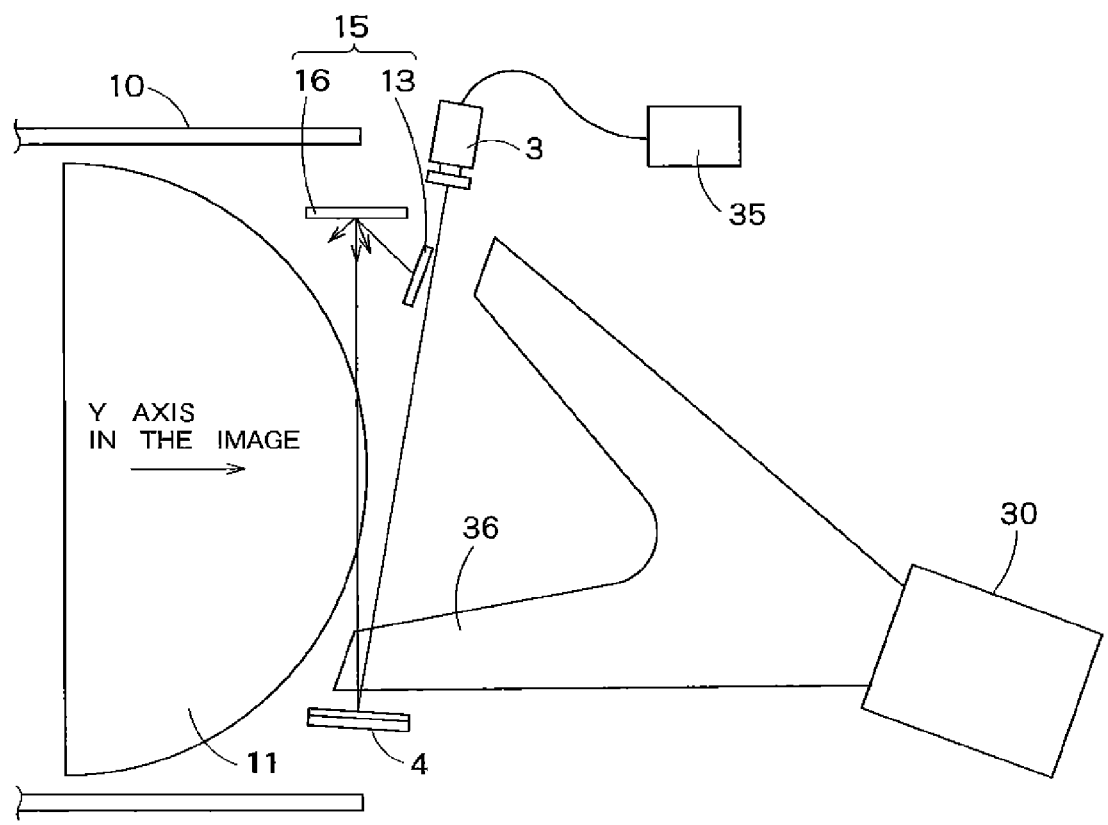
F I G. 10

APPARATUS AND METHOD FOR DETECTING SUBSTRATES

TECHNICAL FIELD

The present invention relates to an apparatus and a method for detecting conditions of a plurality of substrates stored in a cassette. In particular, this invention is suitable for detecting conditions of a plurality of semiconductor wafers stored in a wafer cassette (or FOUP).

BACKGROUND ART

In the past, a method of mapping based on shade detection (i.e., a shade sensor scanning method) has been known as the method of detecting the conditions of the plurality of wafers stored in the wafer cassette (or FOUP). Namely, this method is intended for mechanically scanning each edge portion of the wafers by using a transmission light switch.

In addition, another method of detecting the conditions of the wafers by taking an image of the wafers stored in the wafer cassette by using a camera and then processing the image has been known. As one technique utilizing the image acquired by such a mapping sensor, there is a method of obtaining and analyzing multiple brightness profile lines, each observed between two points perpendicular to each wafer surface.

RELATED ART DOCUMENT

Patent Document 1: JP2005-5347A
Patent Document 2: JP2005-520350T

While the aforementioned method of mapping based on scanning each shade portion by using the sensor is simple and thus convenient, there is a need for attaching the sensor to a certain structural portion. Further, this method requires a relatively long time for mechanically scanning each object (or edge portion). Besides, there is a need for providing another sensor to be exclusively used for detecting unwanted projection or projections.

Herein, what is meant by "detecting (unwanted) projections" is detecting the conditions of some wafers that are stored in the wafer cassette while projecting forward relative to a preset position.

On the other hand, in the method of analyzing the brightness profile lines obtained from the image, presence or absence of each wafer and/or crossing wafer is judged from a position of each peak of the profile lines (this peak corresponds to reflection from each wafer edge portion) and each space between two adjacent profile lines. Therefore, this analysis is quite susceptible to local disturbance.

To solve this problem, one method of reducing or eliminating negative impact of such local disturbance by increasing the number of the brightness profile lines to be added has been proposed.

However, in the above image processing method utilizing the reflection of each wafer edge portion, the reflectance should be lowered if each wafer is coated with a certain coating agent or the like. Therefore, in some cases, the reflected image cannot be adequately detected, thus relatively degrading the reliability, as compared with the wafer detection method utilizing the transmission light switch.

DISCLOSURE OF THE INVENTION

The present invention was made in light of the above problems of the related art. Therefore, it is an object of this invention to provide a new substrate detection apparatus and a method of using this apparatus, which can detect more accurately and rapidly the conditions of the plurality of substrates stored in the cassette.

One feature of the present invention is a substrate detection apparatus adapted for detecting conditions of a plurality of substrates stored in a cassette, comprising: a collimating reflector located on one side of the plurality of substrates; illumination means configured to radiate light in a planar state toward the collimating reflector such that edge portions of the substrates are located in an optical path of the light; image acquiring means configured to acquire a passing light image including the edge portions of the substrates, the passing light image being formed on the collimating reflector with the light radiated in the planar state from the illumination means; and image processing means configured to process the passing light image obtained by the image acquiring means, thereby detecting the conditions of the substrates stored in the cassette.

Preferably, the illumination means includes a surface light source.

Preferably, the illumination means includes a point light source configured to radiate the light toward the collimating reflector, and a retroreflector configured to reflect the light, which has been reflected and collimated by the collimating reflector, toward the collimating reflector.

Preferably, the point light source and image acquiring means are arranged substantially coaxially relative to each other.

Preferably, the surface light source or point light source includes a light emitting diode.

Preferably, the collimating reflector includes a parabolic mirror.

Preferably, the collimating reflector includes a curved mirror formed of a plurality of flat mirrors combined together into a substantially curved surface as a whole.

Another feature of the present invention is a method of detecting the conditions of the plurality of substrates stored in the cassette, comprising: an illumination step of radiating light in a planar state from an illumination means toward a collimating reflector located on one side of the substrates such that edge portions of the substrates are located in an optical path of the light; an image acquiring step of taking a passing light image including the edge portions of the substrates by using an image acquiring means, the passing light image being formed on the collimating reflector with the light radiated in the planar state from the illumination means; and a detection step of processing the passing light image obtained by the image acquiring means by using an image processing means, thereby detecting the conditions of the substrates.

Preferably, the illumination means includes the surface light source.

Preferably, in the illumination step, the light is radiated toward the collimating reflector from a point light source, and the light, which has been reflected and collimated by the collimating reflector, is then reflected toward the collimating reflector by a retroreflector with the edge portions of substrates located in the optical path of the light.

Preferably, the point light source and image acquiring means are arranged substantially coaxially relative to each other.

Preferably, the surface light source or point light source includes the light emitting diode.

Preferably, the collimating reflector includes the parabolic mirror.

Preferably, the collimating reflector includes the curved mirror formed of the plurality of flat mirrors combined together into the substantially curved surface as a whole.

BRIEF DESCRIPTION OF THE DRAWINGS

FIG. 1A is a side view showing general construction of a substrate detection apparatus according to one embodiment of this invention together with a FOUP in which a plurality of wafers are stored.

FIG. 1B is a plane view showing general construction of a substrate detection apparatus according to one embodiment of this invention together with a FOUP in which a plurality of wafers are stored.

FIG. 3 is a plan view of the substrate detection apparatus according to another embodiment of this invention.

FIG. 4 is a plan view of the substrate detection apparatus according to one modification of the embodiment shown in FIG. 3.

FIG. 7 is a view for explaining the first example of the present invention so as to explain a method of judging whether the substrate in the inclination state can be processed, or not.

FIG. 8 is a plane view, for explaining a second example of the present invention, of main components of a substrate detection apparatus.

FIG. 9 is a plane view, for explaining a third example of the present invention, of main components of a substrate detection apparatus.

FIG. 10 is a plane view, for explaining a fourth example of the present invention, of main components of a substrate detection apparatus.

MODE FOR CARRYING OUT THE INVENTION

Figure 2:
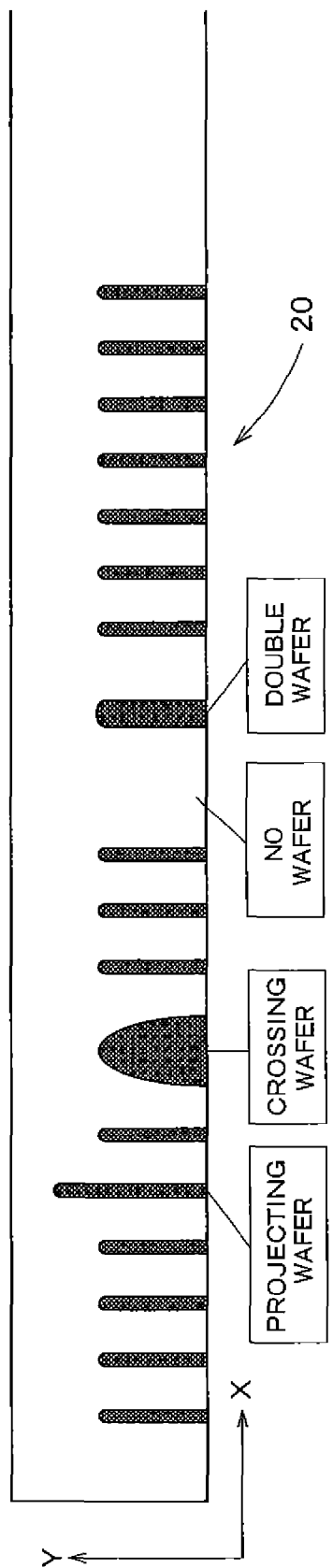
FIG. 2 is a view showing an image obtained by the substrate detection apparatus shown in FIGS. 1A and 1B.

Hereinafter, one exemplary substrate detection apparatus according to one embodiment of the present invention and a method using this apparatus will be described with reference to the drawings.

As shown in FIGS. 1A and 1B, the substrate detection apparatus 1 according to this embodiment is configured for detecting conditions of a plurality of semiconductor wafers 11 respectively stored in a FOUP (or wafer cassette) 10.

Each semiconductor wafer 11 has a flat disk-like shape and is carried in and carried out relative to the FOUP 10 by a hand attached to a distal arm end of a wafer carrier robot.

In the substrate detection apparatus 1, a bright point light source 2 including a light emitting diode (LED) is provided in a substantially coaxial position relative to an image acquiring means 3 including a CCD camera (or single-lens camera).

The light emitted from the point light source 2 is radiated toward a collimating reflector 4 including a radiation mirror, and is then collimated by the collimating reflector 4.

In place of using a proper parabolic mirror, the collimating reflector 4 may include a curved mirror formed of a plurality of small flat mirrors combined together into a substantially curved surface as a whole.

A retroreflector 5 is arranged to be opposed to the collimating reflector 4. This retroreflector 5 includes a μ-CCR plate (CCR: Corner Cube Reflector).

The image acquiring means 3 is connected with an image processing means 6 via a transmission cable. Namely, each image obtained by the image acquiring means 3 will be transmitted to the image processing means 6 via the transmission cable.

In the case of detecting the conditions of the wafers (or substrates) 11 by using the substrate detection apparatus 1 constructed as described above, the light is first radiated from the point light source 2, and is then reflected and collimated by the collimating reflector 4.

Thereafter, the light reflected by the collimating reflector 4 is reflected again, toward the collimating reflector 4, by the retroreflector 5 arranged to be opposed to the collimating reflector 4 (Illumination step).

As a result, a passing light image including each edge portion of the plurality of wafers 11 is formed on the collimating reflector 4 with the light reflected by the retroreflector 4. Namely, in an optical path of the reflected light reflected toward the collimating reflector 4 by the retroreflector 5, the edge portions of the plurality of wafers 11 are located, respectively.

Then, the passing light image that is formed on the collimating reflector 4 and includes the respective edge portions of the plurality of wafers 11 is acquired by the image acquiring means 3 which includes the CCD camera (Image acquiring step).

As shown in FIG. 1B, a mirror normal line with respect to the collimating reflector 4 is arranged, in a plan view, to be parallel with a camera optical axis of the image acquiring means (or CCD camera) 3. Thus, each image of the wafers can be formed to be parallel, relative to one another, in the passing light image.

FIG. 2 schematically shows the passing light image 20 formed on the collimating reflector 4 and obtained by the image acquiring means 3.

In the passing light image 20, shades of the respective edge portions of the plurality of wafers 11 can be seen as a plurality of local shade portions (or low brightness portions). Therefore, with analysis of such a passing light image 20 by using the image processing means 6, the conditions of the plurality of wafers 11 stored in the cassette 10 can be detected (Detection step).

More specifically, with analysis of the number of pixels of each shade portion and/or each space between the shade portions, judgment on whether or not the wafer 11 is present in each slot of the cassette 10, judgment on presence of any double wafer, judgment on presence of any crossing wafer, and/or judgment on presence of any projecting wafer (or amount of projection thereof) can be performed.

Herein, the "double wafer" refers to the case in which two wafers are stored in the same slot while being overlapped relative to each other. The "crossing wafer" refers to the case in which the wafer is stored between left and right slots of different levels. The "projecting wafer" refers to the case in which the wafer is stored in the wafer cassette while projecting forward relative to a preset position.

In the passing light image 20 shown in FIG. 2, if the wafer is not present in a certain slot, the shade portion corresponding to this case is lacked. In addition, if the projecting wafer is present, the shade portion corresponding to this case has a greater length in a Y-axial direction, as compared with the other shade portions. Furthermore, if the crossing wafer is present, the shade portion corresponding to this case has a greater width in an X-axial direction, as compared with the other shade portions. Besides, this shade portion is seen over two slots of different levels. Additionally or alternatively, if the double wafer is present, the shade portion corresponding to this case is double the width in the X-axial direction, as compared with the other shade portions.

According to the embodiment having such a feature as described above, various desired effects as described below can be obtained.

First, this embodiment employs one kind of the image processing method utilizing the camera. In principle, however, this method is somewhat close to a scanning method using a transmission shade sensor. Therefore, this image processing method is less susceptible to the reflectance of each wafer 11 to be detected, thus providing more reliable detection on the conditions of each wafer 11 stored in the cassette.

Second, since the passing light image 20 can be obtained over a certain wide range (in the Y-axial direction) with respect to each edge portion of the wafers 11, the sensor can serve to securely detect the projection of some wafers 11, while serving as the mapping sensor. This effect cannot be obtained by performing the scanning operation only once with the transmission shade sensor of the related art.

Additionally, since each wafer 11 projecting out from the preset position can be detected from a change in the length in the Y-axial direction of each corresponding shade portion, the amount of projection of the wafer 11 can be readily quantified.

This embodiment can eliminate necessity for the mechanical scanning operation as performed with the conventional transmission shade sensor, thus significantly simplifying the entire system as well as reducing the time required for the detection.

Furthermore, the detection on the double wafer can be judged from a value of the area of each shade portion, wherein each detected value is markedly changed between the case of the double wafer and the normal case. Therefore, as compared with the related art utilizing each profile of an object, the detection on the double wafer can be performed more securely.

In addition, since the passing light image 20 for all of the wafers 11 can be obtained at a time by using the single camera, a significantly small and compact substrate detection apparatus 1 can be achieved.

Next, the substrate detection apparatus 1A according to another embodiment of this invention will be described, with reference to FIG. 3.

As described above, in the substrate detection apparatus 1 shown in FIGS. 1A and 1B, the light emitted from the point light source 2 is first reflected and collimated by the collimating reflector 4. Then, the collimated light is further reflected by the retroreflector 5.

On the other hand, in the substrate detection apparatus 1A shown in FIG. 3, a transmission surface light source 12 is provided in place of the retroreflector 5 shown in FIGS. 1A and 1B, such that the collimated light can be radiated from the surface light source 12 toward the collimating reflector 4.

The transmission surface light source 12 includes an LED light source 13 having LED elements longitudinally arranged in a line therein, and a diffusion transmission plate 14 configured to transmit therethrough the light radiated from the LED light source 13. For example, the diffusion transmission plate 14 includes an obscure or frosted glass plate.

Initially, the light just after radiated from the LED light source 13 is in a relatively uneven state. However, once transmitted through the diffusion transmission plate 14, this light can be changed into a surface light source having a substantially even and homogeneous brightness.

Therefore, also in the case of using the substrate detection apparatus 1A shown in FIG. 3, the same effect as obtained by the substrate detection apparatus 1 shown in FIGS. 1A and 1B can be obtained. Namely, the passing light image that is formed on the collimating reflector 4 and includes the respective edge portions of the plurality of wafers 11 can be similarly acquired by using the image acquiring means 3 including the CCD camera. Then, the so-obtained passing light image can be analyzed in the same manner by using the image processing means 6.

FIG. 4 shows another substrate detection apparatus 1B according to one modification of the embodiment shown in FIG. 3. In this apparatus 1B, a reflection surface light source 15 is used.

In this reflection surface light source 15, the light is first radiated from the LED light source 13 and then reflected by a diffusion reflector 16. Thus, with this reflection surface light source 15, the light can also be radiated toward the collimating reflector 4, while being in an adequately even and homogeneous state.

Namely, also in the case of using the substrate detection apparatus 1B shown in FIG. 4, the same effect as presented by the substrate detection apparatus 1 shown in FIGS. 1A and 1B can be obtained.

While the present invention has been shown and described with reference to several embodiments thereof, it will be understood that there is no intent to limit the invention by such disclosure, and that various alterations and/or modifications can be made thereto. Namely, from the scope defined by the appended claims, it will be obvious that such alterations and/or modifications should also fall within the technical scope of this invention.

Some kinds of examples according to the present invention will be described hereunder.

First Example

A First example according to the present invention will be described with reference to FIGS. 5 to 7.

Generally, the substrates 11 are transferred by a substrate carrier robot (hereinafter simply called "robot") from one cassette to the other cassette after the conditions of containing the substrates 11 in the cassette 10 are detected.

In the past, if the conditions of containing the substrates 11 are not normal, an operation of robot is stopped in order to prevent a collision between the robot and the substrates 11 and/or an abnormal grasping of the substrate 11 by the robot. In this case, however, the robot will be stopped even when the containing conditions are slightly deviated from the normal containing conditions. Thereby, there is a problem that the throughput of an entire substrate processing apparatus including the robot will be lowered.

On the other hand, when the conditions of containing the substrates 11 are detected by the substrate detection apparatus according to the present invention, even if a substrate 11 is dislocated from a preset position, it can be judged whether the substrate 11 can be transferred by correcting some operational parameters, such as operational positions, of the robot. Accordingly, when a transfer of the substrate 11 has been judged to be doable, the substrate 11 can be transferred by correcting the operational parameters, such as operational positions of the robot, based on the detected values of the containing conditions of the substrates 11.

As explained above, the substrates 11 can be transferred by the robot even in a case that the robot must have been stopped under the conventional art. Thereby, the throughput of the entire substrate processing apparatus including the robot can be improved.

An example of specific process will be mentioned hereunder.

(1) The conditions of containing the substrates 11 in the cassette 10 are detected by the substrate detection apparatus according to the present invention.

Figure 5:
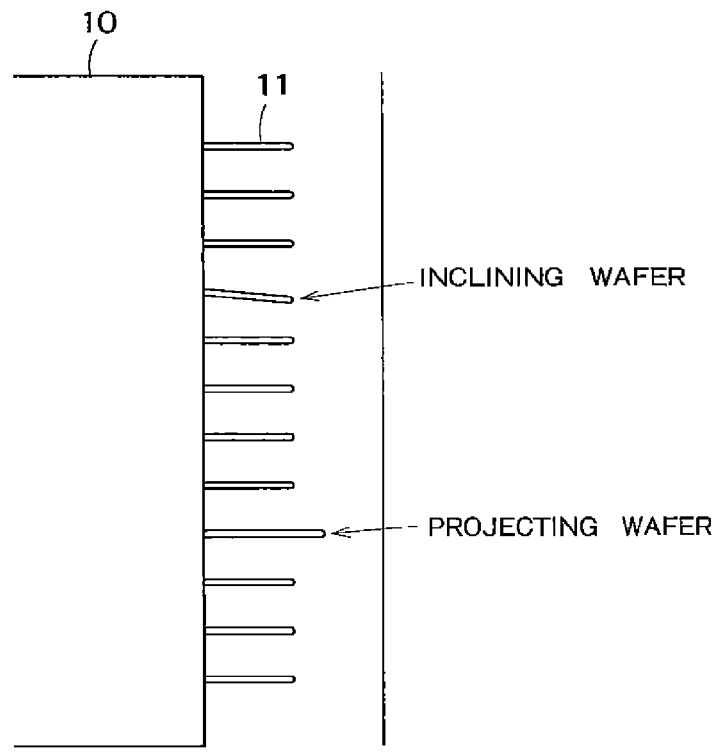
FIG. 5 is a side view, for explaining a first example of the present invention, of a cassette storing a plurality of substrates, part of which are in states of inclination and projection.
Figure 6:
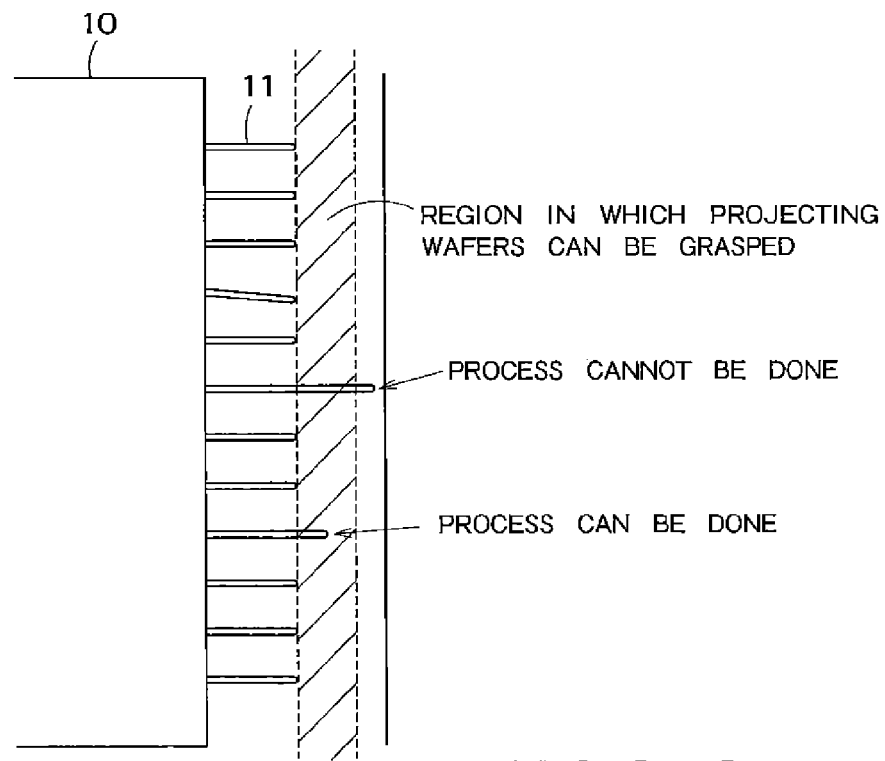
FIG. 6 is a view for explaining the first example of the present invention so as to explain a method of judging whether the substrate in the projection state can be processed, or not.

(2) When a projection of the substrate 11 has been detected (refer to FIG. 5), it is judged whether the substrate 11 can be grasped by the robot, based on the detected amount of the projection (refer to FIG. 6). If the grasp of the substrate 11 has been judged to be doable, the projected substrate 11 is grasped by the robot by correcting the operational positions of the robot based on the detected amount of the projection. On the other hand, if the grasp of the projected substrate 11 has been judged to be undoable, necessary steps, such as stopping operations, are taken.

(3) When an inclination of the substrate 11 has been detected (refer to FIG. 5), it is judged whether the substrate can be grasped by the robot, based on the detected distance between the inclined substrate 11 and a substrate 11 below the same (refer to FIG. 7). If the grasp of the substrate 11 has been judged to be doable, the inclined substrate 11 is grasped by the robot by correcting the operational parameters, such as operational positions of the robot, based on the detected amount of inclination. On the other hand, if the grasp of the inclined substrate 11 has been judged to be undoable, necessary steps, such as stopping operations, are taken.

(4) When both a projection and an inclination of the substrate 11 have been detected, a combination of the above-mentioned processes (2) and (3) is performed.

The term "inclination of substrate" is used to mean the state where a substrate within the cassette 10 has inclined downward with respect to a preset position (refer to FIGS. 5 and 6).

The criteria for judging whether the robot is able to grasp the substrate 11 can be appropriately determined according to, for example, the structure of the substrate grasping mechanism of the robot.

Second Example

A second example according to the present invention will be described with reference to FIG. 8.

When there are more than one cassette, the substrate detection apparatus according to the present invention may be applied to each of the cassettes.

On the other hand, as shown in FIG. 8, an image acquiring means 31 and a light source (illumination means) 32 may be disposed on a robot 30 so that the containing conditions of the substrates 11 are detected by moving the robot 30 to the cassette 10 to be detected. In this case, one set of the image acquiring means and the light source can be used for more then one cassette 10. Thereby, the apparatus can be made compact and the manufacturing cost thereof can be decreased.

In this example, the light from the light source 32 mounted on the robot 30 is reflected by a diffusion plate 33 toward the edge portions of the substrates 11, and further reflected by a reflection plate 34 toward the image acquiring means 31.

Third Example

A third example according to the present invention will be described hereunder with reference to FIG. 9.

Generally, the substrates 11 are processed by an automated system, and operators do not always watch the processes performed by the automated system. Therefore, when a failure of substrate transfer by the robot 30 or a collision has occurred, it is usually difficult to determine the cause thereof.

In this regard, by storing the images of the cassette 10, etc., obtained by the image acquiring means 31 in a storage means 35 (refer to FIG. 9), it will become possible to analyze the images acquired when an abnormal event, such as a failure of substrate transfer by the robot 30 or a collision, occurred. Thereby, the cause of the abnormal event can be detected, and measures for preventing recurrences of the abnormal event can be examined.

Specifically, images of the cassette 10, etc., obtained by the image acquiring means 31 of the substrate detection apparatus according to the present invention are stored in the storage means 35 so as to make it possible to refer to images in the past, if necessary.

Only the newest images may be kept remained as long as the storage capacity of the storage means 35 makes it possible, and old images may be deleted (e.g., overwritten). In this regard, deletions (e.g., overwriting) of old images may be stopped when an abnormal event has been detected. Thereby, images acquired within a specific time period before the abnormal event can be kept from being deleted.

Moreover, the image acquiring means 31 may be mounted on the robot 30 similar to the second example (refer to FIG. 8), or at a position other than the robot (refer to FIG. 9). When the image acquiring means 31 is mounted on the robot 31, images of the containing conditions of the wafers 11 shown in FIG. 5, etc., can be recorded, and images of any positions can be acquired from any angles by moving the robot 30. In the latter case, angles and positions for taking images can be suitably chosen in order to examine the cause of the abnormal event and measures for preventing recurrences.

When the image acquiring means 31 is mounted at a position other than the robot, a fixed point observation can be made, regardless of movements of the robot. A moving means and/or a rotating means for the image acquiring means may be disposed.

Fourth Example

A fourth example according to the present invention will be described with reference to FIG. 10 (and FIG. 4).

In the past, when the robot 30 is operated to transfer substrates in a state that some slippages have occurred at frictional fastening portions of the robot 30 and/or some deformations of robot members have occurred due to a collision between the robot 30 and an apparatus, etc., the robot 30 may fail to transfer a substrate and/or collide with an apparatus. Moreover, some dedicated detecting means need to be provided in order to detect the above-mentioned slippages and deformations so that the size of apparatus will be enlarged and the costs thereof will be increased.

In this regard, the substrate detection apparatus according to the present invention makes it possible to acquire an image of a specific posture of the robot 30 in the normal state and store the image in the storage means 35. Then, the stored image of the robot 30 in the normal state can be compared with an image of the robot 30 which is acquired in a state that the robot 30 is controlled to take the specific posture. Thereby, the above-mentioned slippages and deformations can be detected based on the comparison between the image of the robot 30 in the normal state and the image of the robot 30 after use. Moreover, a dedicated detecting means does not need to be provided so that an enlargement of the apparatus and an increase of the costs can be avoided.

An example of a specific process will be described hereunder.

(1) An image (reference image) of the robot 30 is acquired by the image acquiring means 3 (refer to FIGS. 4 and 10) in a state that the robot 30 is controlled to take a specific posture in a normal state (refer to FIG. 10).

(2) The obtained image is stored in the storage means 35.

(3) When the above-mentioned slippages and deformations of the robot 30 are to be detected, an image (comparative image) of the robot 30 which is acquired in a state that the robot 30 is controlled to take the specific posture.

(4) The comparative image is compared with the reference image, and it can be determined that some slippages and/or deformations have occurred if there is a difference between the reference image and the comparative image.

When the comparative image and the reference image are displaced with each other in the vertical directions, it is highly probable that the hand 36 has been bent and/or some bolts have become loose. On the other hand, when the comparative image and the reference image are displaced with each other in the longitudinal direction of the hand 36, it is highly probable that the driving means of the robot 30 has been deteriorated to produce some positional errors. As explained above, the causes of abnormal events of the robot 30 can be inferred.

The causes of abnormal events may be automatically inferred by a computer so as to display the inferred results. Some thresholds about the differences between comparative images and reference images may be preliminary set, and some slippages and/or deformations are judged to have occurred in the robot 30 when the differences of comparative/reference images have exceeded the preliminary set thresholds. The above-mentioned judgments can be made about some kinds of differences between comparative images and reference images. For example, the judgments can be made about vertical/horizontal displacements, or each element such as a width of the hand image, or combinations thereof.

Furthermore, operational parameters of the robot 30 may be corrected based on the results of judgments/comparisons. Thus, the robot 30 can continue the transferring operations even when some displacements and/or deformations have occurred, as long as the transferring operations can be made doable by correcting the operational parameters of the robot 30. As a result, the time period in which the robot 30 is out of service can be decreased. Moreover, more information can be obtained if more than one kinds of postures are used as the above-mentioned specific posture.

The invention claimed is:

1. A substrate detection apparatus adapted for detecting conditions of a plurality of substrates stored in a cassette, comprising:
    a curved collimating reflector located on one side of the plurality of substrates;
    illumination means configured to radiate light in a planar state toward the curved collimating reflector such that edge portions of the substrates are located in an optical path of the light;
    image acquiring means configured to acquire a passing light image including the edge portions of the substrates as parallel shade portions, the passing light image being formed on the curved collimating reflector with the light radiated in the planar state from the illumination means; and
    image processing means configured to process the passing light image obtained by the image acquiring means and to detect length in a parallel direction of the respective parallel shade portions corresponding to the edge portions of the substrates in the passing light image, thereby judging the presence of substrates stored in the cassette which project out from a preset position in the parallel direction, and quantifying an amount of the projection thereof,
    wherein at least some of the parallel shade portions have differing lengths.

2. The substrate detection apparatus according to claim 1, wherein the illumination means includes a surface light source.

3. The substrate detection apparatus according to claim 1, wherein the illumination means includes a point light source configured to radiate the light toward the curved collimating reflector, and a retroreflector configured to reflect the light, which has been reflected and collimated by the curved collimating reflector, toward the curved collimating reflector.

4. The substrate detection apparatus according to claim 3, wherein the point light source and the image acquiring means are arranged coaxially relative to each other.

5. The substrate detection apparatus according to claim 2, wherein the surface light source or the point light source includes a light emitting diode.

6. The substrate detection apparatus according to claim 1, wherein the curved collimating reflector includes a parabolic mirror.

7. The substrate detection apparatus according to claim 1, wherein the curved collimating reflector includes a curved mirror formed of a plurality of flat mirrors combined together into a curved surface as a whole.

8. A method of detecting conditions of a plurality of substrates stored in a cassette, comprising:
    an illumination step of radiating light in a planar state from an illumination means toward a curved collimating reflector located on one side of the substrates such that edge portions of the substrates are located in an optical path of the light;
    an image acquiring step of taking a passing light image including the edge portions of the substrates as edge portions of parallel shade portions by using an image acquiring means, the passing light image being formed on the curved collimating reflector with the light radiated in the planar state from the illumination means; and
    a detection step of processing the passing light image obtained by the image acquiring means by using an image processing means and detecting length in a parallel direction of the respective parallel shade portions corresponding to the edge portions of the substrates in the passing light image, thereby judging the presence of substrates stored in the cassette which project out from a preset position in the parallel direction, and quantifying an amount of the projection thereof,
    wherein at least some of the parallel shade portions have differing lengths.

9. The method of detecting the substrates according to claim 8, wherein the illumination means includes a surface light source.

10. The method of detecting the substrates according to claim 8, wherein, in the illumination step, the light is radiated toward the curved collimating reflector from a point light source, and the light, which has been reflected and collimated by the curved collimating reflector, is then reflected toward the curved collimating reflector by a retroreflector with the edge portions of substrates located in the optical path of the light.

11. The method of detecting the substrates according to claim 10, wherein the point light source and the image acquiring means are arranged coaxially relative to each other.

12. The method of detecting the substrates according to claim 9, wherein the surface light source or point light source includes a light emitting diode.

13. The method of detecting the substrates according to claim 8, wherein the curved collimating reflector includes a parabolic mirror.

14. The method of detecting the substrates according to claim 8, wherein the curved collimating reflector includes a curved mirror formed of a plurality of flat mirrors combined together into a curved surface as a whole.

* * * * *